(12) United States Patent
Xu et al.

(10) Patent No.: US 11,113,431 B2
(45) Date of Patent: Sep. 7, 2021

(54) MBD-BASED THREE-DIMENSIONAL PROCESS DESIGNING METHOD AND PLATFORM FOR TYPICAL AUTOMOBILE MACHINED PART

(71) Applicant: WUHAN UNIVERSITY OF TECHNOLOGY, Wuhan (CN)

(72) Inventors: Jinli Xu, Wuhan (CN); Xiaolei Liu, Wuhan (CN); Fengyun Huang, Wuhan (CN); Chunxiao Chen, Wuhan (CN); Qiangqiang Niu, Wuhan (CN); Bing Jia, Wuhan (CN); Qian Yu, Wuhan (CN); Weiteng Liu, Wuhan (CN); Mingya Du, Wuhan (CN); Qinggu Pan, Wuhan (CN); Shijun Luo, Wuhan (CN); Delong Hu, Wuhan (CN); Fancong Zeng, Wuhan (CN); Wei Xu, Wuhan (CN); Jiwei Zhu, Wuhan (CN)

( * ) Notice: Subject to any disclaimer, the term of this patent is extended or adjusted under 35 U.S.C. 154(b) by 0 days.

(21) Appl. No.: 16/758,033

(22) PCT Filed: Mar. 14, 2019

(86) PCT No.: PCT/CN2019/078102
§ 371 (c)(1),
(2) Date: Apr. 21, 2020

(87) PCT Pub. No.: WO2020/034632
PCT Pub. Date: Feb. 20, 2020

(65) Prior Publication Data
US 2021/0165920 A1 Jun. 3, 2021

(30) Foreign Application Priority Data
Aug. 17, 2018 (CN) .......................... 201810939985.2

(51) Int. Cl.
*G06F 30/20* (2020.01)
*G06F 30/18* (2020.01)
(Continued)

(52) U.S. Cl.
CPC .............. *G06F 30/10* (2020.01); *G06F 30/12* (2020.01); *G06F 30/13* (2020.01); *G06F 30/18* (2020.01);
(Continued)

(58) Field of Classification Search
CPC .......... G06F 30/10; G06F 30/20; G06F 30/18; G06F 30/13; G06F 30/12; G06K 9/6224;
(Continued)

(56) References Cited

U.S. PATENT DOCUMENTS

| 2003/0085889 | A1* | 5/2003 | Chin ...................... G06T 17/10 345/419 |
| 2016/0063136 | A1* | 3/2016 | Kannan ................... G06F 30/00 703/1 |

FOREIGN PATENT DOCUMENTS

| CN | 104408240 A | * | 3/2015 |
| CN | 104408240 A | | 3/2015 |

(Continued)

OTHER PUBLICATIONS

"Three-dimensional process model construction method based on processing element", Shao Li et al., Journal of Northwestern Polytechnical University, vol. 33, No. 4, pp. 644-650.
(Continued)

*Primary Examiner* — Omar F Fernandez Rivas
*Assistant Examiner* — Pursottam Giri
(74) *Attorney, Agent, or Firm* — KandareIP, LLC

(57) ABSTRACT

The present invention is related to computer-assisted process design, and an MBD-based three-dimensional process designing method and platform for a typical automobile
(Continued)

machined part are disclosed. By taking three-dimensional CAD software as a carrier, an MBD design model, and a process MBD model as a data output, the design flow comprises steps such as establishment of MBD-related standards, creation of an MBD design model, feature classification and creation of a feature library, feature recognition and information extraction, generation of manufacturing elements, clustering of the manufacturing elements and generation of procedures, sequencing of the procedures, and creation of manufacturing features body and procedure models. According to the present invention, the process MBD model integrating procedure models and manufacturing feature bodies can be rapidly generated, visualization of the process design flow can be realized, and the process design efficiency can be improved, thereby laying a foundation for the integration of CAD/CAPP/CAM.

8 Claims, 5 Drawing Sheets

(51) Int. Cl.
  *G06F 30/13* (2020.01)
  *G06F 30/10* (2020.01)
  *G06F 30/12* (2020.01)
  *G06K 9/62* (2006.01)
  *G06F 30/17* (2020.01)
  *G06F 30/15* (2020.01)

(52) U.S. Cl.
  CPC ........... *G06F 30/20* (2020.01); *G06K 9/6224* (2013.01); *G06K 9/6232* (2013.01); *G06K 9/6259* (2013.01); *G06K 9/6267* (2013.01)

(58) Field of Classification Search
  CPC ... G06K 9/6232; G06K 9/6259; G06K 9/6267
  See application file for complete search history.

(56) References Cited

FOREIGN PATENT DOCUMENTS

| | | | |
|---|---|---|---|
| CN | 105354353 A | * | 2/2016 |
| CN | 105354353 A | | 2/2016 |
| CN | 107895062 A | * | 4/2018 |
| CN | 107895062 A | | 4/2018 |

OTHER PUBLICATIONS

Office action related to CN patent application No. 201810939985.2, dated Aug. 26, 2019.

* cited by examiner

MBD-BASED THREE-DIMENSIONAL PROCESS DESIGNING METHOD AND PLATFORM FOR TYPICAL AUTOMOBILE MACHINED PART

CROSS-REFERENCE TO RELATED APPLICATION

This application is a United States National Stage Application filed under 35 U.S.C 371 of PCT Patent Application Serial No. PCT/CN2019/078102, filed Mar. 14, 2019, which claims Chinese Patent Application Serial No. CN 201810939985.2, filed Aug. 17, 2018, the disclosure of all of which are hereby incorporated by reference in their entirety.

TECHNICAL FIELD

The present invention belongs to the technical field of computer-aided process design, in particular to an MBD-based three-dimensional process designing method and platform for a typical automobile machined part.

BACKGROUND

At present, the following technology is commonly used in the art.

Model Based Definition (MBD), which is a computer application oriented digital product definition technology, has a core concept that detailed information related to a three-dimensional solid model of a product, such as sizes, geometric tolerances, references, face roughness, etc., are integrated into the three-dimensional solid model, and definition information of the product is completely expressed by the integrated three-dimensional solid model which is used as an unique basis during manufacturing of the product. Accordingly, the method adopted in the conventional structure design process, in which a solid model is expressed by a two-dimensional CAD drawing, is completely abandoned, so that data uniqueness during the whole product life cycle is guaranteed. The ambiguity generated during data transmission is eliminated, and the efficiency of product design is greatly improved.

At present, the MBD technology, both at home and abroad, is mainly applied in the design and assembly of aerospace products, but rarely in the design of automobile products. Although a small part of automobile enterprises start to use the MBD technology, it is still in a preliminary exploration stage, and a large-scale standardized production system has not been formed.

In summary, problems existing in the prior art are as follows:

non-uniform MBD application standards or no normalized standard system: some enterprises have developed application standards for the MBD technology according to their basic needs and related national standards, and the application standards are adapted to enterprises' own products; however, the "wide variety of" standards for the MBD technology provided by different enterprises cause a great barrier in cross-industry and cross-enterprise cooperation, resulting in difficulty in forming a unified standard system and application environment;

outdated digital modeling means used in the CAPP system: the creation of manufacturing feature bodies and procedure models of three-dimensional process design of products now relies on the basic modeling function of three-dimensional CAD software, and designers create models by manual operations, which causes a lot of repeated work, so that a corresponding model cannot be quickly and accurately created, and the requirements of the MBD data set on normalization, accuracy and integrity of three-dimensional data cannot be met; and poor information integration of the CAPP system: at present, in an MBD-based three-dimensional CAPP system, information integration lacks support of a complete three-dimensional process data model, and data is not systematically managed, so that it is difficult to perform three-dimensional digital simulation on process and manufacturing procedures, that is, a barrier is formed in data flow of CAD/CAPP/CAM, therefore, the poor quality of process plans cannot be judged through feedback results of the process digital simulation, and the high integration of information cannot be realized.

In the prior art, the efficiency of process design of parts is low, and the design process is not visible.

Therefore, it is necessary to introduce the MBD technology into design of automobile parts, and it is urgent to find a three-dimensional process design method which can quickly and accurately create an MBD model, forming a CAD/CAPP/CAM highly-integrated MBD application system.

The difficulties and significance for solving the above technical problems are as follows.

The difficulties for solving the above technical problems include:

recognition of manufacturing features, which refers to recognizing manufacturing feature information with specific manufacturing semantics from a design model via a certain algorithm; generally, there are four categories of feature recognition algorithms, i.e. volume decomposition based feature recognition algorithms, track based feature recognition algorithms and hybrid feature recognition algorithm, and all the exiting algorithms have the problems in recognition efficiency and complexity; and creation of a process MBD model, i.e. creation of manufacturing feature bodies and procedure models; the process MBD model can fully express the evolution of a part from a blank to a final design model through rough machining, semi-finish machining and finish machining; now, the creation of process modes is mostly carried out via manual interaction and parametric modeling, so that the universality of modeling is poor, and the creation efficiency is low, which is contrary to the concept of rapid creation of procedure models.

The practical significance for solving the above problems are as follows:

normalized application of the MBD technology is realized, so that a unified standard system and application environment are formed, and the barrier in cross-industry and cross-enterprise cooperation is cleared;

rapid and accurate creation of procedure models and the manufacturing feature bodies is realized, and a process MBD model with better readability is generated, which is of positive significance for manufacturing personnel to quickly acquire manufacturing information, thereby shortening the manufacturing period of the part; and digital simulation is carried out on the process design flow to form a process design feedback mechanism, so that the process design process is optimized, and the quality of the process design is improved.

SUMMARY

To overcome the problems in the prior art, the present invention provides an MBD-based three-dimensional process designing method and platform for a typical automobile machined part.

According to the invention, the MBD-based three-dimensional process designing method for the typical automobile machined part is realized as follows, the MBD-based three-dimensional process designing method for the typical automobile machined part includes the following steps of:

by taking three-dimensional CAD software as a carrier, an MBD design model as an unique data input, and a three-dimensional process MBD model as a data output, sequentially carrying out establishment of MBD-related standards, creation of an MBD design model, feature classification and creation of a feature information library, feature recognition and information extraction, generation of manufacturing elements, clustering of the manufacturing elements and generation of procedures, sequencing of the procedures, and creation of manufacturing feature bodies and procedure models; and generating a process MBD model integrating the procedure models and the manufacturing feature bodies to realize visualization of a process design flow.

Further, the MBD-based three-dimensional process designing method for the typical automobile machined part specifically includes the following steps of:

Step 1, establishing MBD-related standards according to requirements for the creation of an MBD design model;

Step 2, according to a set of the established MBD standards, determining all process information of part process design, including sizes and dimensional tolerances, geometric tolerances and references, face roughness degrees, technical requirements, process information and attribute annotations, and defining and labelling, in a three-dimensional labeling module of the CAD software, all the information of the process design to complete the creation of the MBD design model;

Step 3: according to a design model of a typical part, carrying out attribute customization and feature classification on features of the model, wherein the customized features are classified according to a manufacturing face adjacency graph (MFAG) of the feature, and the classified features include individually manufactured faces, steps, holes, grooves and bosses; and then completing creation of a manufacturing feature information library in an XML file format, wherein the feature information library includes attributes of the customized feature faces and edges in various types, wherein attributes of a face mainly include a type of the face, a normal vector, and inner and outer loop information of the face; and attributes of an edge include a type of the edge, a normal vector, and concavity and convexity of the edge;

Step 4: according to a STEP-format file of the part design model, acquiring an attribute adjacency graph (AAG) of a part, deleting all transitional features, blank faces and edges adjacent to the blank faces, and simplifying the attribute adjacency graph of the part to a manufacturing face adjacency graph (MFAG) of a feature; carrying out feature matching on the MFAG and the manufacturing feature information library, and if the matching is successful, recognizing corresponding features; if the matching is not successful, carrying out attribute decomposition on the MFAG, and integrating or dividing corresponding faces to obtain a plurality of feature sub-graphs, then carrying out feature matching on the feature sub-graphs and the manufacturing feature information library, and if the matching is successful, recognizing corresponding features; and for the recognized features, extract product manufacturing information of each feature manufacturing face, including basic process design information and process auxiliary information, and outputting and storing the product manufacturing information in the XML file format to a background;

Step 5: according to content of a process decision rule, extracting feature information from the manufacturing feature information library, and carrying out information mapping on the feature information and a feature manufacturing rule library to complete the creation of a manufacturing element, wherein the manufacturing element comprises all manufacturing information of a feature or a feature face, including a manufacturing element name, a manufacturing feature type, a manufactured portion, a manufacturing method, a manufacturing precision, a manufacturing tool, a manufacturing machine tool, a manufacturing time, a work fixture, a cutting amount, a manufacturing allowance, a main shaft rotation speed and a cutting speed;

Step 6, for the manufacturing element created in Step 5, by means of a manufacturing element clustering algorithm based on a weighted attribute fuzzy c-means (WAFCM), according to the influences of different manufacturing attributes on a clustering result, assigning different weights to attributes such as the manufacturing method, the manufacturing precision, the manufacturing tool, the manufacturing machine tool and the work fixture, determining a number of clusters c, an iteration ending threshold c and a number of iterations T, and clustering manufacturing elements with similar manufacturing attributes to generate manufacturing procedures by integration;

Step 7, by means of a genetic algorithm, carrying out optimized sequencing on the procedures generated in step 6 to obtain an optimal procedure sequencing list for the part; and Step 8: with regard to the feature to be manufactured by each procedure, according to a reverse generation thought, using a half-space intersection or parametric modeling method to create, from the MBD design model, a manufacturing feature body of an Nth procedure (assuming that there are N procedures in total), wherein a procedure MBD model of the Nth procedure is a collection of the MBD design model and process information of the procedure, and therefore, a procedure model of an (N−1)th procedure is generated by means of carrying out a Boolean addition calculation on the manufacturing feature body and the design model, and on this basis, creating manufacturing feature bodies and procedure models of the remaining procedures, until a final blank model is created, and then completing the creation of the procedure model.

Further, in Step 1, the MBD standards includes:

(1) MBD three-dimensional model definition and creation standards, including basic definition and data set completeness requirements for a part MBD model, three-dimensional modeling and assembly requirements for an MBD model, and technical requirements for generating a three-dimensional engineering drawing;

(2) MBD three-dimensional labeling standards, including expression of an MBD model data set in a three-dimensional environment, specifically including selection of views of an MBD model, indication of sizes, dimensional tolerances and fits, indication of geometric tolerances and references and face roughness degrees, specifications for drawing a sectional view, part references and arrangement in an MBD assembly model, and specifications for drawing a part list; and (3) MBD process and tooling expression standards, including expression specifications for a metal cutting process and symbols and parameters thereof for a machined part, and expression specifications for positioning and fixing methods and symbols thereof.

Further, the Step 6 specifically includes the following steps of:

Firstly, creating a manufacturing element clustering mathematical model based on a weighted attribute fuzzy c-means (WAFCM); defining n manufacturing elements generated based the feature information rule library and the feature manufacturing rule library as n samples in a data set to be clustered $X=\{x_1, x_2, \ldots, x_n\} \subset R^s$; by means of typical fuzzy c-mean clustering analysis, dividing x1, x2, ..., xn into c fuzzy subsets according to the similarity of manufacturing attributes corresponding to the n manufacturing elements in X, and defining the fuzzy subsets as a procedure set corresponding to the features V={v1, v2, ..., vc}, i.e. clustering centers of fuzzy clustering;

then, according to the classification of the manufacturing attributes of the manufacturing elements in Step 5, defining p manufacturing attributes contained in each sample in the data set X, which are denoted by $P=\{p_1, p_2, \ldots, p_n\} \subset R^p$, as an attribute vector of the n manufacturing elements such that in the WAFCM manufacturing element clustering algorithm, the kth sample point is denoted as xk=(x1k, x2k, ..., xpk), k∈{1, 2, ..., n}, and the clustering centers of the manufacturing elements is denoted as vi=(vi1, vi2, ..., vip), i∈{1, 2, ..., c}; calculating the influences of information defined by different manufacturing attributes of each clustering sample on the overall clustering, and assigning a weight W to each manufacturing attribute, wherein if a manufacturing attribute provides a positive effect on the clustering of the samples, a relatively large weight is assigned, otherwise a relatively small weight is assigned;

then, defining a fuzzy membership matrix U=[uijk]∈R, i=1, 2, ..., c; j=1, 2, ..., p; k=1, 2, ..., n, and building an objective function representing weighted similarity between the manufacturing element sample data points and the procedure clustering centers such that on the basis of typical fuzzy c-means clustering, the manufacturing attributes are weighted to obtain an objective function Jm of the modified WAFCM algorithm:

$$\min J_m(U, V, W) = \sum_{i=1}^{c} \sum_{k=1}^{n} \sum_{j=1}^{p} (u_{ijk})^m \| w_j x_{jk} - v_{ij} \|^2;$$

in the formula, uijk represents a membership degree of a clustered manufacturing element sample point xk belonging to a vith procedure on a manufacturing attribute j and reflects the similarity degree between the sample point and the clustering center, if uijk is close to 1, it indicates that the degree of belonging to the clustering center is high, and if close to 0, the degree of belonging to the clustering center is low; m represents a weighted index, m∈(1, +∞), and takes a value of m=2;

then, according to a clustering criterion, with constraint conditions of the objective function, finding an optimal (U, V, W) to minimize Jm(U, V, W), including calculating a partial derivative of Jm(U, V, W) with respect to each of U, V, W, and by means of the Lagrange multiplier method, calculating the values of uijk, vij, wj which minimize Jm(U, V, W) according to the constraint conditions, as shown in the following formulas:

$$u_{ijk} = \left[ \sum_{h=1}^{c} \sum_{l=1}^{p} \left( \frac{\| w_j \cdot x_{jk} - v_{ij} \|}{\| w_j \cdot x_{lk} - v_{hl} \|} \right)^{\frac{2}{m-1}} \right]^{-1},$$

-continued $$i \neq h, j \neq l, v_{ij} = \frac{\sum_{k=1}^{n} (u_{ijk})^m x_{jk} \cdot w_j}{\sum_{k=1}^{u} (u_{ijk})^m};$$

$$w_j = \frac{\sum_{k=1}^{n} \sum_{i=1}^{c} u_{ijk}}{n},$$

and finally, solving the WAFCM clustering algorithm:

1) determining input variables of the algorithm, including the manufacturing element data set X, the attribute vector P, the number of clusters c, the weighted index m, the iteration threshold c, and the maximum number of iterations T, and setting an iteration counter t=0;

2) normalizing the data set X, initializing a membership degree matrix U(0) to satisfy a constraint condition $$\sum_{i=1}^{c} \sum_{j=1}^{p} u_{ijk} = 1, u_{ijk} \in [0, 1],$$

and setting an initial attribute weight matrix W(0) with each item having an initial value of wj=1/p, wherein p is the number of manufacturing element attributes;

3) continuously updating the membership matrix U(t)=[uijk]t, the prototype matrix V(t)=[vij]t and the attribute weight matrix W(t)=[wj]t according to the formulas uijk, vij, wj; and 4) if t=T or |Jt−Jt−1|≤ε, accumulating the membership degrees of the manufacturing element samples based on each weighted attribute to obtain the membership degrees of the manufacturing element samples for procedure clustering according to a calculation formula as shown in $$u_{ik} = \sum_{j=1}^{p} u_{ijk};$$

and determining the procedure to which each manufacturing element belongs according to the membership degrees; otherwise, repeating the step 3).

Further, in Step 7, the manufacturing attributes, such as the manufacturing method, the manufacturing precision, the manufacturing tool, the manufacturing machine tool and the work fixture, of the procedures generated by clustering in the Step 6 are defined as the phenotype of a gene, and the gene is encoded to obtain an initial population with a potential solution; then, based on the principle of "survival of the fittest", evolution is carried out from generation to generation to generate an optimal individual of the population, wherein in each generation, firstly, the individuals of the population are recombined, then each individual of the population is evaluated according to a fitness function which takes minimizing the manufacturing time as an optimization target, individuals with high fitness are selected and subjected to crossover and mutation operations according to a certain probability to generate a next generation of population, and an optimal individual of the last generation of population is decoded to obtain an approximate optimal solution, i.e. a sequence of procedures;

specifically including the following steps of:

encoding: defining the manufacturing attributes, such as the manufacturing method, the manufacturing precision, the manufacturing tool, the manufacturing machine tool and the work fixture, of the procedures generated by clustering in Step 6 as the phenotype of a gene and encoding the gene by means of a binary encoding method;

initial population obtaining: generating a series of initial code chains by means of a random method to obtain an initial population with a potential solution;

chromosome recombination: according to manufacturing rules and manufacturing attribute constraints, recombining chromosomes of the population before an iteration of initial chromosomes and after each crossover and mutation;

carrying out calculation according to a fitness function which takes minimizing the manufacturing time as an optimization target to evaluate individuals of the population;

crossover: carrying out single-point crossover by selecting individuals with high fitness in the population, selecting breakpoints according to a crossover probability, and carrying out single-point crossover on chromosomes behind the breakpoints to form new chromosomes;

mutation: selecting individuals with high fitness in the population, selecting a plurality of individuals according to a mutation probability, and randomly selecting a gene locus from the selected plurality of individuals to be changed into an allele; and iteration: generating a new generation of population by each iteration, and when a preset number of iterations is reached or it converges to an optimal solution, ending the calculation; and decoding the optimal individual of the last generation of population to obtain an approximate optimal solution, i.e. the optimal sequence of procedures.

Further, in Step 8, the manufacturing feature body is a collection of volumes to be cut off by each procedure, and for the creation of the manufacturing feature body, a half-space intersection or parametric modeling method is used to obtain the manufacturing feature body according to attribute characteristics and generation modes of the interactive and non-interactive features obtained by classification of the manufacturing features;

wherein features that are recognized by directly carrying out matching on the manufacturing face adjacency graph MFAG of the manufacturing feature and the manufacturing feature information library, are non-interactive features, and the parametric modeling method is directly used to generate the manufacturing feature body;

features that are recognized by carrying out attribute decomposition on the manufacturing face adjacency graph NMFAG, integrating or dividing corresponding faces to generate feature sub-graphs, and carrying out matching on the feature sub-graphs and the manufacturing feature information library, are interactive features which do not directly match with any feature pattern, and the half-space intersection method is used to generate the manufacturing feature body;

a geometric relationship between the manufacturing feature bodies and the procedure models includes: for a machined part with n procedures, in reverse generation of the procedure models, in the sense of geometric modeling, the procedure model WPMj of a jth procedure is generated by means of carrying out a Boolean addition calculation on a procedure model WPMj+1 and the manufacturing feature bodies of a (j+1)th procedure, i.e., $$WPM_j = WPM_{j+1} \oplus \sum_{k=1}^{m} MFV_k^{j+1}$$

in the formula, $\Sigma$ represents a set of types and does not represent a summation operator; $1 \leq j \leq n$, $1 \leq k \leq m$; $MFV_i^{j+1}$ represents a kth manufacturing feature body of the (j+1)th procedure, and m is the number of manufacturing feature bodies; and $\oplus$ represents a Boolean addition operator;

expression of a process MBD model: the process model is an expression of a collection of the manufacturing feature bodies and the procedure models, and the process MBD model is expressed as follows:

$$PIM = \sum_{j=1}^{n} \left\{ WPM_i \cup \sum_{k=1}^{m} MFV_k^i \cup PI_i \right\}$$

in the formula, PIM represents the process MBD model of the machined part; WPMi represents a procedure model of an ith procedure; $MFV_k^i$ represents a kth manufacturing feature body of the ith procedure, and m is the number of manufacturing feature bodies; PIi represents process information belonging to the procedure MBD model corresponding to the ith procedure.

The half-space intersection method: a half-enclosed space is formed by extending and intersection of faces, and for a certain manufacturing feature, a manufacturing face set MFi and an adjacent face set AFj of the manufacturing feature are obtained, and the face sets are extended and intersected to obtain half-space bodies H{MFi} and H{AFj}; the manufacturing feature is obtained by means of carrying out a Boolean intersection calculation on the two half-spaces, i.e. $MFV_{ij}=H\{MF_i\}\oplus H\{AF_j\}$.

Another object of the present invention is to provide a computer program executing an MBD-based three-dimensional process designing method for a typical automobile machined part.

Another object of the present invention is to provide a terminal equipped with a controller implementing an MBD-based three-dimensional process designing method for a typical automobile machined part.

Another object of the present invention is to provide a computer-readable storage medium including instructions that, when executed on a computer, cause the computer to perform an MBD-based three-dimensional process designing method for a typical automobile machined part.

Another object of the present invention is to provide an MBD-based three-dimensional process designing platform for a typical automobile machined part, the platform including:

an MBD related standard establishing module for establishing MBD-related standards according to requirements for the creation of an MBD design model;

an MBD design model creation module for, according to a set of the established MBD standards, determining all process information of part process design, including sizes and dimensional tolerances, geometric tolerances and references, face roughness degrees, technical requirements, process information and attribute annotations, and defining and labelling, in a three-dimensional labeling module of CAD software, all the information of the process design to complete the creation of the MBD design model;

an attribute customization and feature classification module for, according to a design model of a typical part, carrying out attribute customization and feature classification on features of the model, wherein the customized features are classified according to a manufacturing face adjacency graph (MFAG) of the feature, and the classified features include individually manufactured faces, steps, holes, grooves and bosses; and then completing creation of a manufacturing feature information library in an XML file format, wherein the feature information library includes attributes of the customized feature faces and edges in various types, wherein attributes of a face mainly include a type of the face, a normal vector, and inner and outer loop information of the face; and attributes of an edge include a type of the edge, a normal vector, and concavity and convexity of the edge;

a feature recognition and information extraction module for, according to a STEP-format file of the part design model, acquiring an attribute adjacency graph (AAG) of a part, deleting all transitional features, blank faces and edges adjacent to the blank faces, and simplifying the attribute adjacency graph of the part to a manufacturing face adjacency graph (MFAG) of a feature; carrying out feature matching on the MFAG and the manufacturing feature information library, and if the matching is successful, recognizing corresponding features; if the matching is not successful, carrying out attribute decomposition on the MFAG, and integrating or dividing corresponding faces to obtain a plurality of feature sub-graphs, then carrying out feature matching on the feature sub-graphs and the manufacturing feature information library, and if the matching is successful, recognizing corresponding features; and for the recognized features, extracting product manufacturing information of each feature manufacturing face, including basic process design information and process auxiliary information, and outputting and storing the product manufacturing information in the XML file format to a background;

a manufacturing element creation module for, according to content of a process decision rule, extracting feature information from the manufacturing feature information library, and carrying out information mapping on the feature information and a feature manufacturing rule library to complete the creation of a manufacturing element, wherein the manufacturing element comprises all manufacturing information of a feature or a feature face, including a manufacturing element name, a manufacturing feature type, a manufactured portion, a manufacturing method, a manufacturing precision, a manufacturing tool, a manufacturing machine tool, a manufacturing time, a work fixture, a cutting amount, a manufacturing allowance, a main shaft rotation speed and a cutting speed;

a manufacturing procedure generation module for, for the created manufacturing element, by means of a manufacturing element clustering algorithm based on a weighted attribute fuzzy c-means, according to the influences of different manufacturing attributes on a clustering result, assigning different weights to attributes such as the manufacturing method, the manufacturing precision, the manufacturing tool, the manufacturing machine tool and the work fixture, determining a number of clusters c, an iteration ending threshold c and a number of iterations T, and clustering manufacturing elements with similar manufacturing attributes to generate manufacturing procedures by integration;

a part optimal procedure sequence obtaining module for, by means of a genetic algorithm, carrying out optimized sequencing on the procedures generated by clustering to obtain an optimal procedure sequencing list for the part; and a process model creation module for, with regard to the feature to be manufactured by each procedure, according to a reverse generation thought, using a half-space intersection or parametric modeling method to create, from the MBD design model, a manufacturing feature body of an Nth procedure (assuming that there are N procedures in total), wherein a procedure MBD model of the Nth procedure is a collection of the MBD design model and process information of the procedure; generating a procedure model of an (N−1)th procedure by means of carrying out a Boolean addition calculation on the manufacturing feature body and the design model; and creating manufacturing feature bodies and procedure models of the remaining procedures, until a final blank model is created, and then completing the creation of the procedure model.

In summary, the invention has the following advantages and beneficial effects.

According to the invention, a basic application system of the MBD technology is established, which includes MBD three-dimensional model definition and creation standards, MBD three-dimensional labeling standards and MBD process and tooling expression standards, so that the MBD design and application process is normalized, the barrier in cross-industry and cross-enterprise cooperation is cleared, thereby laying a foundation for forming a unified standard system and application environment.

The MBD design model is taken as a unique reference in a design and manufacturing process of a products, so that the data uniqueness during the whole life cycle of the product is guaranteed, and the accuracy of the design process is guaranteed.

By means of the manufacturing element clustering algorithm based on a weighted attribute fuzzy c-means, various manufacturing attributes of the manufacturing elements can be weighted according to the importance of the manufacturing attributes to realfize accurate clustering of the manufacturing elements and generate manufacturing procedures, so that workshop layout can be simplified, and manufacturing efficiency can be improved.

The adopted half-space intersection method can quickly generate a process MBD model integrating procedure models and manufacturing feature bodies, and compared with the procedure models in the prior art, the model has better readability and is of positive significance for manufacturing personnel to quickly acquire manufacturing information, thereby shortening the manufacturing period of the part. Visualization of the process design flow can be realized, and the process design efficiency can be improved, thereby laying a foundation for the integration of CAD/CAPP/CAM.

Figure 5:
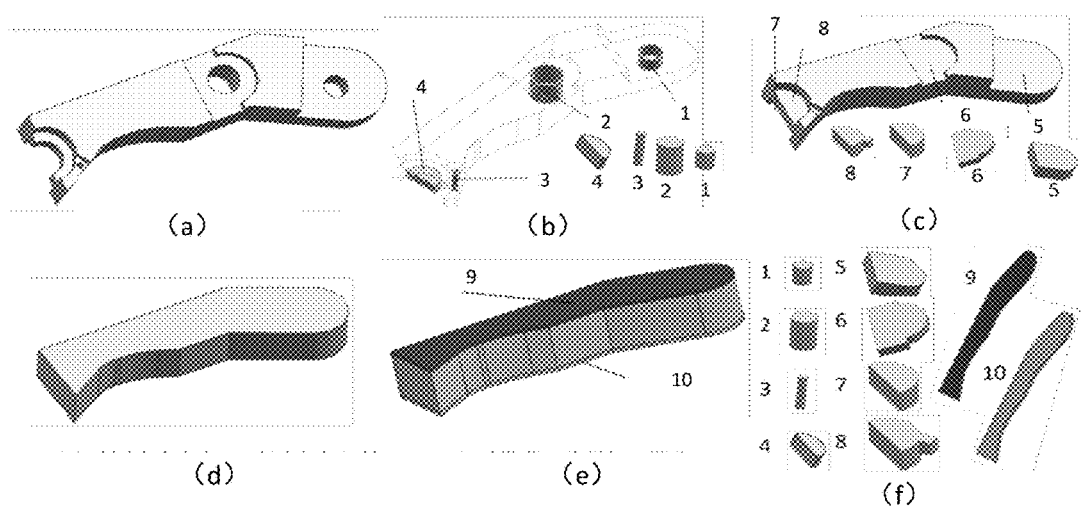
Figure 6:
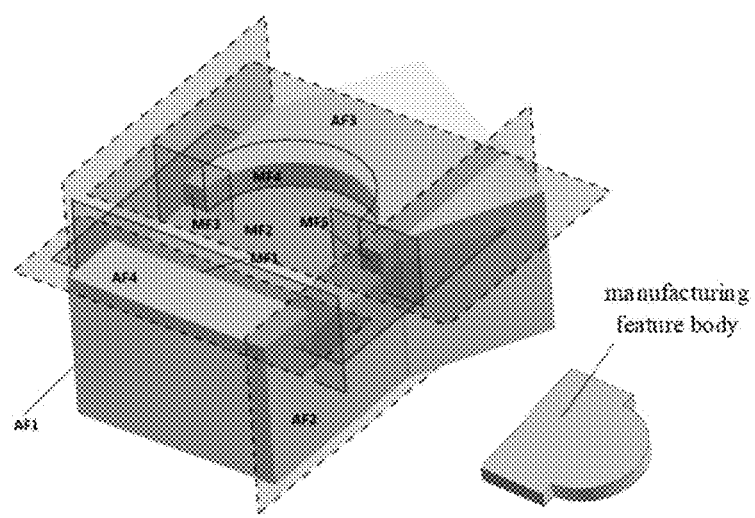
Figure 7:
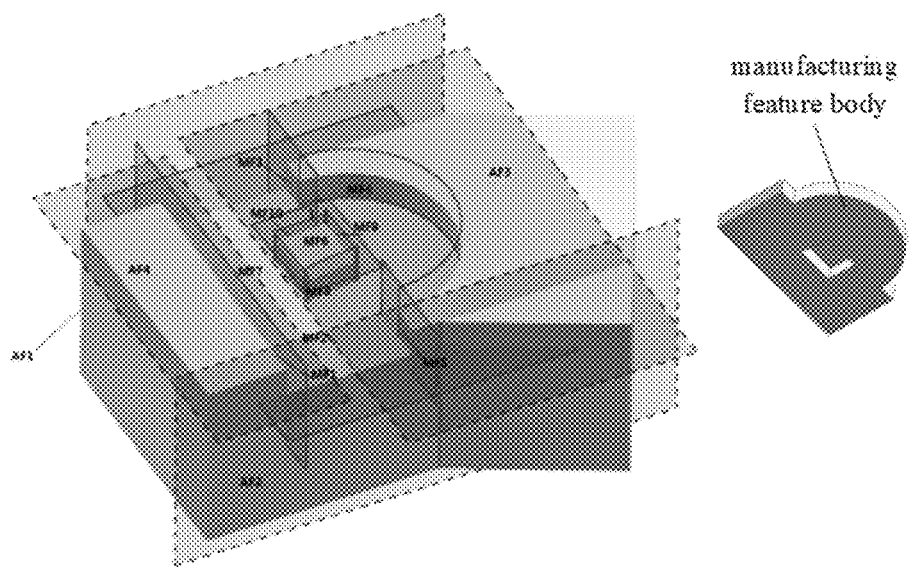
Figure 8:
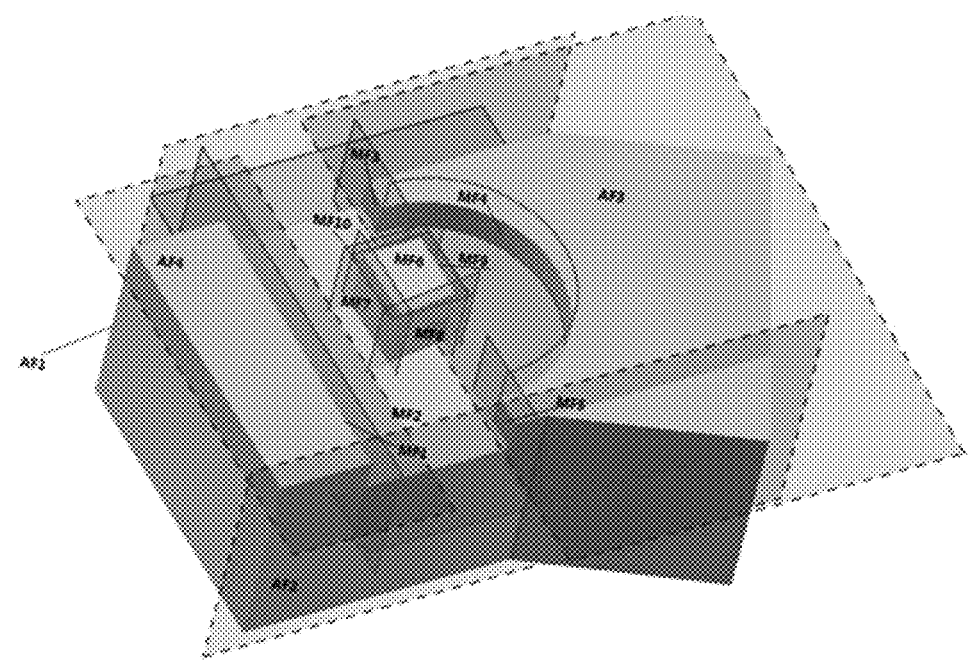
Figure 9:
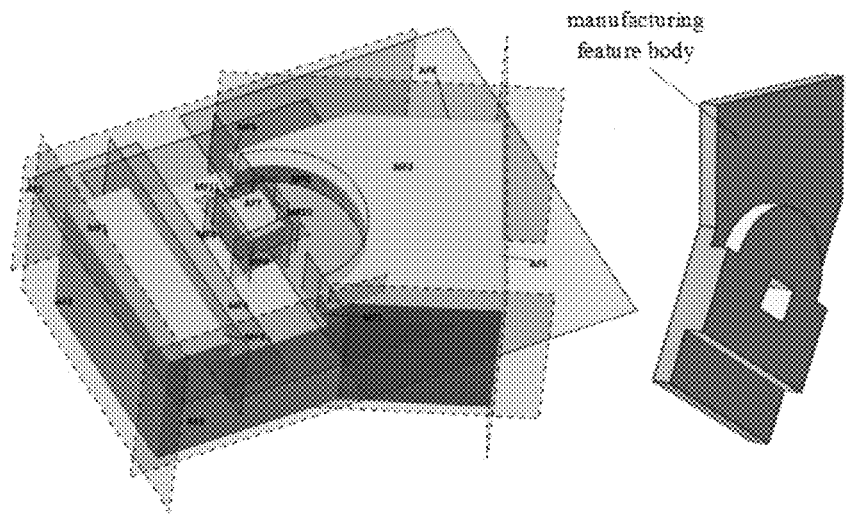
Figure 10:
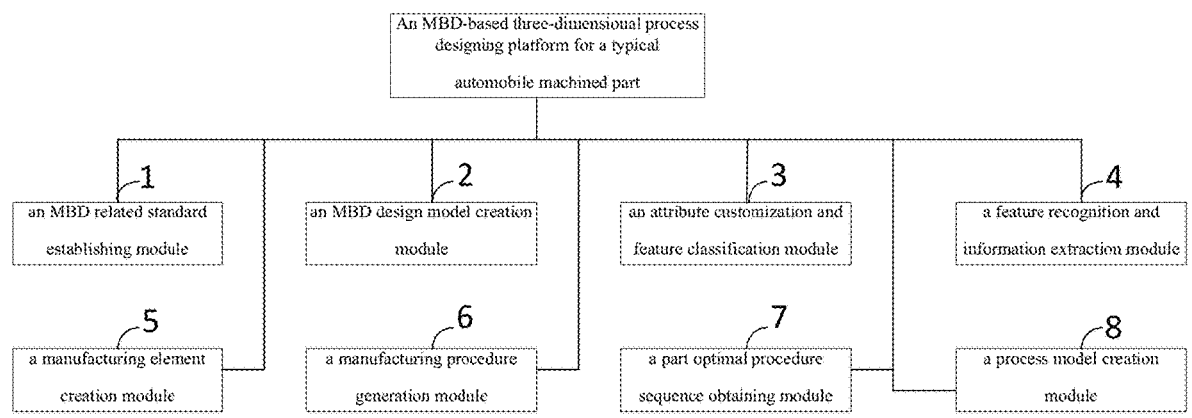

in the figure: (a) three-dimensional model of a part; (b) attribute adjacency graph AAG of the part; (c) manufacturing face adjacency graph MFAG of the step;

FIG. 5 is a flowchart illustrating creation of manufacturing feature bodies provided by an embodiment of the present invention;

FIG. 6 is a diagram illustrating creation of a manufacturing feature body of a general recess feature provided by an embodiment of the present invention;

FIG. 7 is a diagram illustrating creation of a manufacturing feature body of a recess feature with a low boss provided by an embodiment of the present invention;

FIG. 8 is a diagram-1 illustrating creation of a manufacturing feature body of a recess feature with a high boss provided by an embodiment of the present invention;

FIG. 9 is a diagram-2 illustrating creation of a manufacturing feature body of a recess feature with a high boss provided by an embodiment of the present invention; and FIG. 10 is a schematic diagram of an MBD-based three-dimensional process designing platform for a typical automobile machined part according to an embodiment of the present invention;

in the figure: 1. MBD-related standard establishing module; 2. MBD design model creation module; 3. attribute customization and feature classification module; 4. feature recognition and information extraction module; 5. manufacturing element creation module; 6, manufacturing procedure generation module; 7. part optimal procedure sequence obtaining module; and 8. process model creation module.

DETAILED DESCRIPTION

In order that the objects, technical solutions, and advantages of the present invention will become more apparent, the present invention will be described in further detail with reference to the embodiments. It is to be understood that the specific embodiments described herein are merely illustrative of the present invention and are not intended to be limiting thereof.

According to the present invention, by taking three-dimensional CAD software as a carrier, an MBD design model as an unique data input, and a process MBD model as a data output, the design flow includes steps such as establishment of MBD-related standards, creation of an MBD design model, feature classification and creation of a feature information library, feature recognition and information extraction, generation of manufacturing elements, clustering of the manufacturing elements and generation of procedures, sequencing of the procedures, and creation of manufacturing feature bodies and procedure models. The final application example of the present invention is realized in a three-dimensional CAPP system with NX as a carrier and developed in C++ and NXopen languages. According to the present invention, the process MBD model integrating procedure models and manufacturing feature bodies can be rapidly generated, visualization of the process design flow can be realized, and the process design efficiency can be improved, thereby laying a foundation for the integration of CAD/CAPP/CAM.

The invention is further described below with reference to the specific embodiments.

Figure 1:
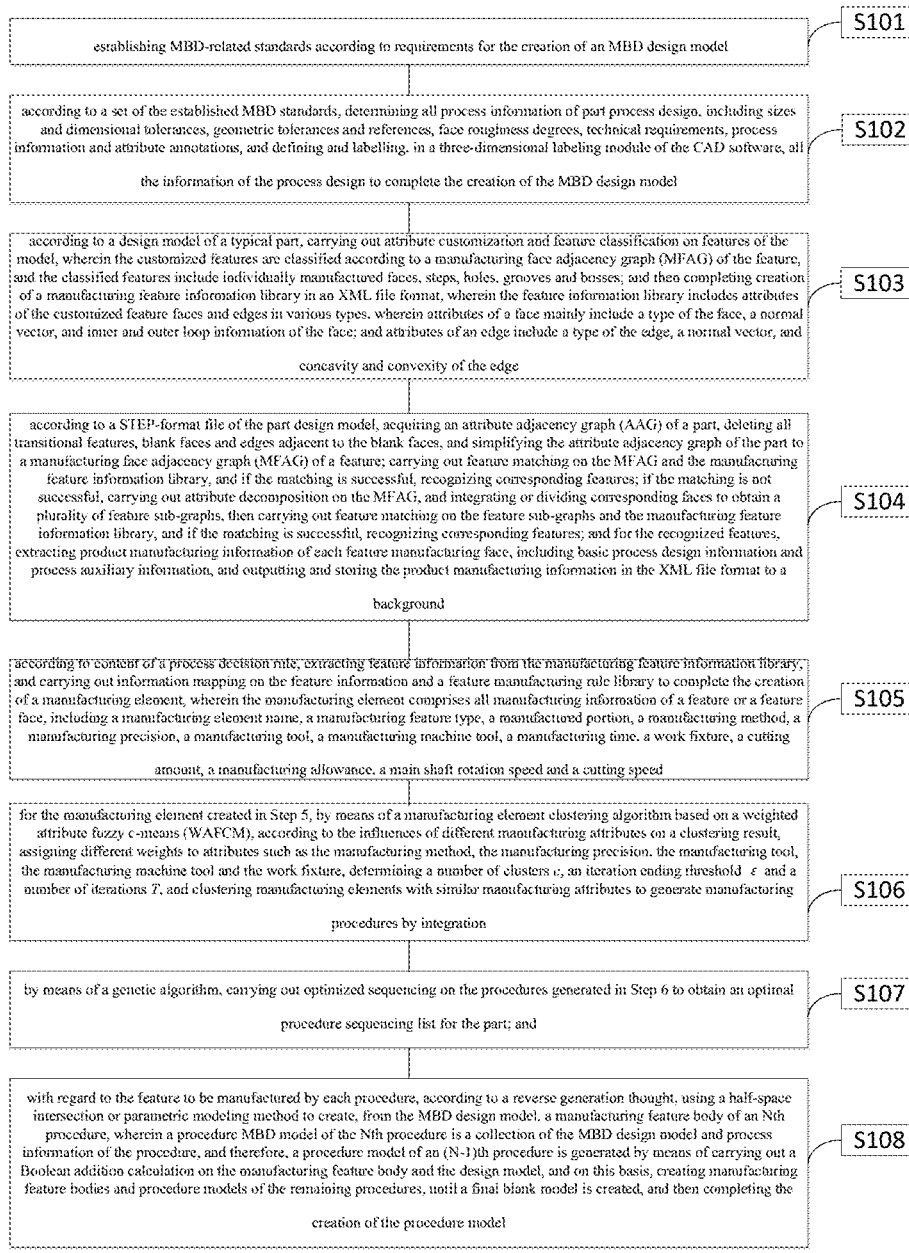
FIG. 1 is a flowchart of an MBD-based three-dimensional process designing method for a typical automobile machined part according to an embodiment of the present invention.

According to an MBD-based three-dimensional process designing method for a machined part provided by the present invention, the process designing method takes three-dimensional CAD software as a carrier, an MBD design model as an unique data input, and a three-dimensional process model as a data output. The process design flow of the method is shown in FIG. 1, and the method includes the following design steps.

S101: MBD-related standards are established according to requirements for the creation of an MBD design model.

S102: according to a set of the established MBD standards, all process design information of part process design is determined, including sizes and dimensional tolerances, geometric tolerances and references, face roughness degrees, technical requirements, process information and attribute annotations. Then, a part design model is imported into CAD software, and in a three-dimensional labeling module of the CAD software, all the information of the process design is defined and labelled to complete the creation of the MBD design model.

S103: according to a design model of a typical part, attribute customization and feature classification are carried out on features of the model, wherein the customized features are classified according to a manufacturing face adjacency graph (MFAG) of the feature, and the classified features include individually manufactured faces, steps, holes, grooves, bosses, etc.; and then creation of a manufacturing feature information library in an XML file format is completed, wherein the feature information library includes attributes of the customized feature faces and edges in various types, wherein attributes of a face mainly include a type of the face, a normal vector, and inner and outer loop information of the face, etc.; and attributes of an edge include a type of the edge, a normal vector, and concavity and convexity of the edge, etc.

S104: According to a STEP-format file of the part design model, an attribute adjacency graph (AAG) of a part is acquired, all transitional features, blank faces and edges adjacent to the blank faces are deleted, and the attribute adjacency graph of the part is simplified into a manufacturing face adjacency graph (MFAG) of a feature. Feature matching is carried out on the MFAG and the manufacturing feature information library, and if the matching is successful, simple non-interactive features, such as simple holes and grooves, are recognized. If the matching is not successful, attribute decomposition is carried out on the MFAG, and corresponding faces are integrated or divided to obtain a plurality of feature sub-graphs, and then feature matching is carried out on the feature sub-graphs and the manufacturing feature information library, and if the matching is successful, other complex interactive features are recognized. For the recognized features, product manufacturing information of each feature manufacturing face is extracted, mainly including basic process design information (the size and tolerance, the face roughness degree, the geometric tolerance and reference, etc.), and process auxiliary information (positioning and clamping information), and the product manufacturing information is output and stored to a background in the XML file format.

S105: according to content of a process decision rule, feature information is extracted from the manufacturing feature information library, and information mapping is carried out on the feature information and a feature manufacturing rule library to complete the creation of a manufacturing element, wherein the manufacturing element includes all manufacturing information of a feature or a feature face, mainly including a manufacturing element name, a manufacturing feature type, a manufactured portion, a manufacturing method, a manufacturing precision, a manufacturing tool, a manufacturing machine tool, a manufacturing time, a work fixture, a cutting amount, a manufacturing allowance, a main shaft rotation speed, a cutting speed, etc.

S106: for n manufacturing elements created in step S105, generation of manufacturing procedures is completed by means of a manufacturing element clustering algorithm based on a weighted attribute fuzzy c-means (WAFCM).

S107: by means of a genetic algorithm and based on the principle of "survival of the fittest", optimized sequencing is carried out on the procedures generated in step S106 to obtain the optimal procedure sequencing list for the part.

S108: with regard to the feature to be manufactured by each procedure, according to a reverse generation thought, a half-space intersection or parametric modeling method is used to create, from the MBD design model, a manufacturing feature body of an Nth procedure (assuming that there are N procedures in total) is created, wherein a procedure MBD model of the Nth procedure is a set of the MBD design model and process information of the procedure, and therefore a procedure model of an (N−1)th procedure is generated by means of carrying out a Boolean addition calculation on the manufacturing feature body and the design model, and on this basis, manufacturing feature bodies and procedure models of the remaining procedures are created, until the final blank model is created, and the creation of the process model is then completed.

The invention is further described below with reference to specific analysis.

In step S101, the main contents of the MBD standards include:

(1) MBD three-dimensional model definition and creation standards, mainly specifying basic definition and data set completeness requirements for a part MBD model, three-dimensional modeling and assembly requirements for an MBD model, technical requirements for generating a three-dimensional engineering drawing, etc.;

(2) MBD three-dimensional labeling standards, mainly specifying expression of an MBD model data set in a three-dimensional environment, mainly including selection of views of an MBD model, indication of sizes, dimensional tolerances and fits, indication of geometric tolerances and references and face roughness degrees, specifications for drawing a sectional view, part references and arrangement in an MBD assembly model, specifications for drawing a part list, etc.; and (3) MBD process and tooling expression standards, mainly including expression specifications for a metal cutting process and symbols and parameters thereof for a machined part, and expression specifications for positioning and fixing methods and symbols thereof.

Moreover, the main related reference standards for establishing the MBD standards include:

GB/T 24734-2009 Technical Product Documentation—Digital Product Definition Data Practices;

GB/T 18780-2002 Geometrical Product Specifications (GPS);

GB/T 18229-2000 Rule of CAD Engineering Drawing;

GB/T 4457-2003 National Standards for Mechanical Drawings;

GB/T 26099-2010 General Principles of Three-Dimensional Modeling for Mechanical Products; and GB/T 10609-2009 National Standards for Technical Drawings.

In step S102, for a complex part with relatively more inner cavities having various machining sizes, the process design information may be clearly expressed by a sectional view, for example, an MBD design model of a differential case on a rear axle of an automobile of a certain model. For a part having a "hedgehog" phenomenon after being labelled, a multi-view or layered expression method may be adopted; the process design information may also be classified to be labelled, and the process design information is mainly divided into four types, namely sizes and dimensional tolerances, geometric tolerances and references, face roughness degrees, technical requirements and process annotations, and the four types of process design information are separately labeled in different views or layers.

Figure 4:
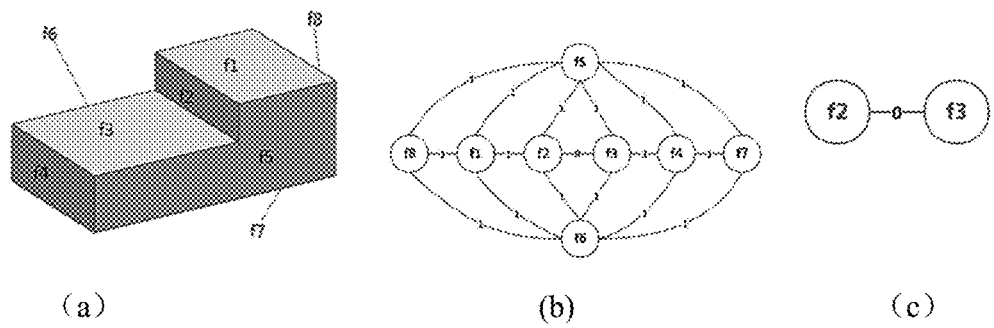
FIG. 4 is a manufacturing face attribute adjacency graph of a step feature provided by an embodiment of the present invention.

In step S103, as shown in FIG. 4, which is an attribute adjacency graph AAG of a step part, in the figure, f1-f8 represent manufacturing faces and its adjacent faces of the step, the number "1" represents that an adjacent edge is convex, and the number "0" represents that an adjacent edge is concave. Blank faces and edges adjacent to the rough faces are deleted, and a step manufacturing face adjacency graph MFAG composed of the faces f2 and f3 is obtained. The attributes of the faces are determined as follows: the face f2 is a planar face, the normal direction is the positive normal direction of the face, the number of outer loops is 1, and the number of inner loops is 0; and the face f3 is a planar face, the normal direction is the positive normal direction of the face, the number of outer loops is 1, and the number of inner loops is 0. The attributes of the adjacent edge are as follows: the edge is a straight linear edge, and the edge is concave. For other customized features, manufacturing face adjacency graphs may also be created for the customized features, and feature information of the customized features may be stored in the machining feature information library.

In step S104, particularly, feature recognition and feature information extraction are implemented in CAD software through a secondary development technology, and feature recognition and process design information extraction can be quickly performed via a secondary development interface provided by the CAD software and related functions provided by the secondary development interface.

In step S106, firstly, a WAFCM manufacturing element clustering mathematical model is created. N manufacturing elements generated based on the feature information rule library and the feature manufacturing rule library are defined as a data set including n samples to be clustered $X=\{x_1, x_2, \ldots, x_n\} \subset R^s$, by means of typical fuzzy c-mean clustering analysis, x1, x2, ..., xn are divided into c fuzzy subsets according to the similarity of manufacturing attributes corresponding to the n manufacturing elements in X, and the fuzzy subsets are defined as a procedure set corresponding to the features $V=\{v1, v2, \ldots, vc\}$, i.e. clustering centers of fuzzy clustering.

Then, according to the classification of the manufacturing attributes of the manufacturing elements in step S105, p manufacturing attributes contained in each sample in the data set X, which are denoted as $P=\{p_1, p_2, \ldots, p_n\} \subset R^p$, are defined as an attribute vector of the n manufacturing elements, such that in the WAFCM manufacturing element clustering algorithm, the kth sample point is denoted as $xk=(x1k, x2k, \ldots, xpk)$, $k \in \{1, 2, \ldots, n\}$, and the clustering centers of the manufacturing elements are denoted as $vi=(vi1, vi2, \ldots, vip)$, $i \in \{1, 2, \ldots, c\}$. To exhibit the function of customized attributes, the influences of information defined by different manufacturing attributes of each clustering sample on the overall clustering are calculated, and a weight W is assigned to each manufacturing attribute, wherein if a manufacturing attribute provides a positive effect on the clustering of the samples, a relatively large weight is assigned, otherwise a relatively small weight is assigned.

Then, a fuzzy membership matrix $U=[uijk] \in R$, $i=1, 2, \ldots, c$; $j=1, 2, \ldots, p$; $k=1, 2, \ldots, n$, is defined, and an objective function representing weighted similarity between the manufacturing element sample data points and the procedure clustering centers is built. On the basis of typical fuzzy c-means clustering, the manufacturing attributes are weighted to obtain an objective function Jm of the modified WAFCM algorithm:

$$\min J_m(U, V, W) = \sum_{i=1}^{c} \sum_{k=1}^{n} \sum_{j=1}^{p} (u_{ijk})^m \| w_j x_{jk} - v_{ij} \|^2$$

In the formula, uijk represents a membership degree of a clustered manufacturing element sample point xk belonging to a vith procedure on a manufacturing attribute j and reflects the similarity degree between the sample point and the clustering center, if uijk is close to 1, it indicates that the degree of belonging to the clustering center is high, and if close to 0, the degree of belonging to the clustering center is low; and m represents a weighted index (a smooth index, usually taking a value of 2), m∈(1, +∞).

Next, according to a clustering criterion, with constraint conditions of the objective function, an optimal (U, V, W) is found to minimize Jm(U, V, W). A partial derivative of Jm(U, V, W) with respect to each of U, V, W is calculated, and by means of the Lagrange multiplier method, the values of uijk, vij, wj which minimize Jm(U, V, W) are calculated according to the constraint conditions, as shown in the following formulas:

$$u_{ijk} = \left[ \sum_{h=1}^{c} \sum_{l=1}^{p} \left( \frac{\| w_j \cdot x_{jk} - v_{ij} \|}{\| w_j \cdot x_{lk} - v_{hl} \|} \right)^{\frac{2}{m-1}} \right]^{-1}, i \neq h,$$

$$j \neq l, v_{ij} = \frac{\sum_{k=1}^{n} (u_{ijk})^m x_{jk} \cdot w_j}{\sum_{k=1}^{n} (u_{ijk})^m}; w_j = \frac{\sum_{k=1}^{n} \sum_{i=1}^{c} u_{ijk}}{n}.$$

Finally, the WAFCM clustering algorithm is solved. Firstly, input variables of the algorithm are determined, mainly including a manufacturing element data set X, a attribute vector P, a number of clusters c, a weighted index m, an iteration threshold ε, and a maximum number of iterations T, and an iteration counter is set as t=0. Next, the data set X is normalized, a membership degree matrix U(0) is initialized to satisfy a constraint condition $$\sum_{i=1}^{c} \sum_{j=1}^{p} u_{ijk} = 1, u_{ijk} \in [0, 1],$$

and an initial attribute weight matrix W(0) is set to have each item having an initial value of wj=1/p, wherein p is the number of the attributes of the manufacturing elements. Then, the membership matrix U(t)=[uijk]t, the prototype matrix V(t)=[vij]t and the attribute weight matrix W(t)=[wj]t are continuously updated according to the formulas uijk, vij, wj. If t=T or |Jt−Jt−1|≤ε, the membership degrees of the manufacturing element samples based on each weighted attribute are accumulated to obtain the membership degrees of the manufacturing element samples for procedure clustering according to a calculation formula as shown in $$u_{ik} = \sum_{j=1}^{p} u_{ijk}.$$

The procedure to which each manufacturing element belongs is determined according to the membership degrees. Otherwise, the previous step is repeated.

Figure 2:
FIG. 2 is a flowchart of a genetic algorithm provided by an embodiment of the present invention.

In step S107, the flow of the genetic algorithm is shown in FIG. 2, and is described in detail as follows:

S201: encoding. The manufacturing attributes, such as the manufacturing method, the manufacturing precision, the manufacturing tool, the manufacturing machine tool and the work fixture, etc., of the procedures generated by clustering in step S106 are defined as the phenotype of a gene, and the gene is encoded by means of a binary encoding method.

S202: initial population obtaining. A series of initial code chains are generated by means of a random method to obtain an initial population with a potential solution.

S203: chromosome recombination. According to manufacturing rules and manufacturing attribute constraints, the chromosomes of the population are recombined before an iteration of initial chromosomes and after each crossover and mutation.

S204: calculation is carried out according to a fitness function which takes minimizing the manufacturing time as an optimization target to evaluate individuals of the population.

S205: crossover. Single-point crossover is carried out by selecting individuals with high fitness in the population, breakpoints are selected according to a certain probability (referred to as crossover probability), and single-point crossover is carried out on chromosomes behind the breakpoints to form new chromosomes.

S206: mutation. Individuals with high fitness in the population are selected, a plurality of individuals are selected according to a mutation probability, and a gene locus is randomly selected from the selected plurality of individuals to be changed into an allele.

S207: Iteration. A new generation of population is generated by each iteration, and when a preset number of iterations is reached or it converges to an optimal solution, the calculation ends. The optimal individual of the last generation of population is decoded to obtain an approximate optimal solution, i.e., an optimal sequence of procedures.

Figure 3:
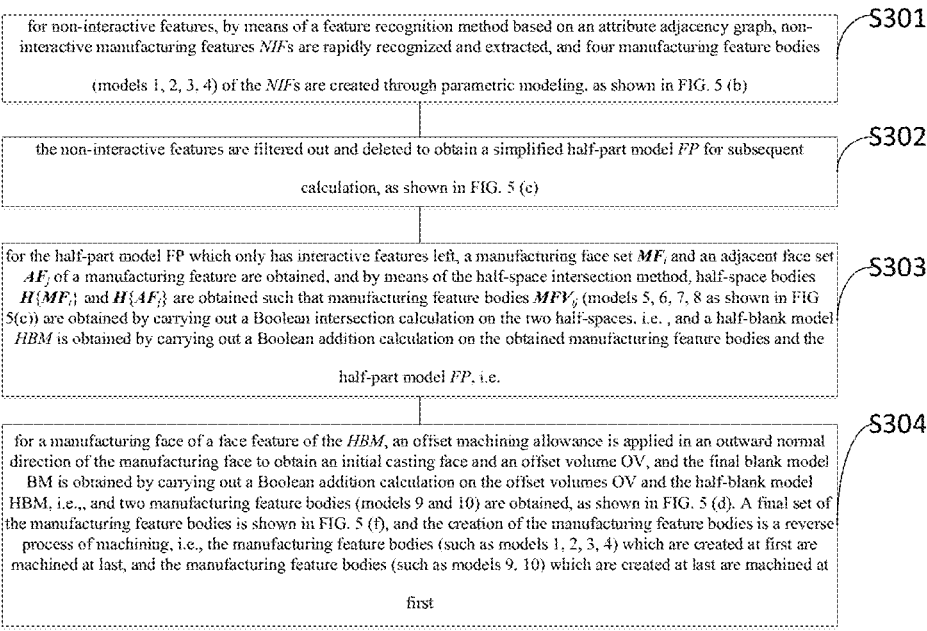
FIG. 3 is a flowchart illustrating steps for creation of manufacturing feature bodies of a part P according to an embodiment of the present invention.

In step S108, the flow of creation of the manufacturing feature bodies of the part P is shown in FIG. 3, and the specific creation process is shown in FIG. 5.

S301: for non-interactive features, by means of a feature recognition method based on an attribute adjacency graph, non-interactive manufacturing features NIFs are rapidly recognized and extracted, and four manufacturing feature bodies (models 1, 2, 3, 4) of the NIFs are created through parametric modeling, as shown in FIG. 5 (b).

S302: the non-interactive features are filtered out and deleted to obtain a simplified half-part model FP for subsequent calculation, as shown in FIG. 5 (c).

S303: for the half-part model FP which only has interactive features left, a manufacturing face set MFi and an adjacent face set AFj of a manufacturing feature are obtained, and by means of the half-space intersection method, half-space bodies H{MFi} and H{AFj} are obtained such that manufacturing feature bodies MFVij (models 5, 6, 7, 8 as shown in FIG. 5(c)) are obtained by carrying out a Boolean intersection calculation on the two half-spaces, i.e. $MFV_{ij}=H\{MF_i\}\otimes H\{AF_j\}$, and a half-blank model HBM is obtained by carrying out a Boolean addition calculation on the obtained manufacturing feature bodies and the half-part model FP, i.e. $HBM=MFV_{ij}-FP$.

S304: for a manufacturing face of a face feature of the HBM, an offset machining allowance is applied in an outward normal direction of the manufacturing face to obtain an initial casting face and an offset volume OV, and the final blank model BM is obtained by carrying out a Boolean addition calculation on the offset volumes OV and the half-blank model HBM, i.e., $BM=HBM\oplus OV$, and two manufacturing feature bodies (models 9 and 10) are obtained, as shown in FIG. 5 (d). A final set of the manufacturing feature bodies is shown in FIG. 5 (f), and the creation of the manufacturing feature bodies is a reverse process of machining, i.e., the manufacturing feature bodies (such as models 1, 2, 3, 4) which are created at first are machined at last, and the manufacturing feature bodies (such as models 9, 10) which are created at last are machined at first.

For the half-space intersection method mentioned in the step S303, it is applicable to different types of complex features, typically various complex recess features (including interactive features such as steps, grooves and the like), and the specific flow of an algorithm for creating manufacturing feature bodies of the complex recess features is described as follows:

Type 1: creation of a manufacturing feature body of a general recess feature. For a general recess feature shown in FIG. 6, manufacturing faces of the general recess feature are labelled as MFi, and adjacent faces of the recess are labelled as AFj, and a maximum connected set of the recess feature is constructed by common incident edges, that is, by extending the manufacturing faces and the adjacent faces, half-space bodies Hi and Hj are obtained. In FIG. 6, the solid line frames represent extended faces of the manufacturing faces, and the positive directions of the extended faces are all directed away from the material side; and the dotted line frames represent extended faces of the adjacent faces, and the positive directions of the extended faces are all directed to the material side, so that it is ensured that the space formed by intersection of the two half-space bodies is an enclosed space. The half-space bodies are represented by sets of faces, in the form that $Hi=\{MFi|i=1, 2, 3, 4, 5\}$, $Hi=\{AFj|j=1, 2, 3, 4\}$. The intersected part of the two half-space bodies is a result of a Boolean intersection calculation of the feature, represented by $MFV_{ij}=H_i\otimes H_j$, i.e., the manufacturing feature body.

Type 2: creation of a manufacturing feature body of a recess feature with a boss. For the recess feature shown in FIG. 7, the height of the boss is smaller than the depth of the recess, so that the recess feature is referred to as a recess feature with a low boss. By means of the half-space intersection method described in Type 1, a manufacturing feature body can be quickly obtained. For a recess feature shown in FIG. 8, the height of the boss is larger than the depth of the recess, so that the recess feature is referred to as a recess feature with a high boss. By means of the half-space intersection method described in Type 1, a manufacturing feature body can be quickly obtained, but the manufacturing feature body cannot completely enclose the manufacturing faces MFi (i=6, 7, 8, 9, 10), therefore, the created manufacturing feature body is incomplete. An improved half-space intersection method is proposed herein. For a manufacturing face MF6 which is higher than adjacent faces, the manufacturing face MF6 is defined as an adjacent face AF7 of the recess feature, and adjacent faces AF3, AF4 are defined as manufacturing faces MF1, MF2 of the recess feature. The manufacturing faces and the adjacent faces are extended to obtain half-space bodies $Hi=\{MFi|i=1, 2, \ldots, 11\}$ and $Hi=\{AFj|j=1, 2, \ldots, 7\}$, and a manufacturing feature body $MFV_{ij}=H^i\otimes H_j$, is also obtained, as shown in FIG. 9.

According to the aforementioned reverse generation process of the procedure models, a Boolean addition calculation is carried out on a procedure model WPMi+1 and a manufacturing feature body MFVi+1 of a next procedure to obtain a procedure model WPMi of a previous procedure, i.e. $WPM_i=WPM_{i+1}\oplus MFV_{i+1}$. Accordingly, the procedure models can be generated in sequence from a part design model until creation of a blank model is completed, and then process design information is added, thereby obtaining procedure MBD models.

Finally, the manufacturing feature bodies and the procedure models of all the procedures are collectively expressed in the same model view, so that a process model of the whole manufacturing process can be formed. The final application example of the present invention is realized in a three-dimensional CAPP system with NX as a carrier and developed in C++ and NXopen languages.

As shown in FIG. 10, an MBD-based three-dimensional process designing platform for a typical automobile machined part provided by the embodiment of the invention includes:

an MBD related standard establishing module 1 for establishing MBD-related standards according to requirements for the creation of an MBD design model;

an MBD design model creation module 2 for, according to a set of the established MBD standards, determining all process information of part process design, including sizes and dimensional tolerances, geometric tolerances and references, face roughness degrees, technical requirements, process information and attribute annotations, and defining and labelling, in a three-dimensional labeling module of CAD software, all the information of the process design to complete the creation of the MBD design model;

an attribute customization and feature classification module 3 for, according to a design model of a typical part, carrying out attribute customization and feature classification on features of the model, wherein the customized features are classified according to a manufacturing face adjacency graph (MFAG) of the feature, and the classified features include individually manufactured faces, stepped, holes, grooves, bosses, etc.; and then completing creation of a manufacturing feature information library in an XML file format, wherein the feature information library includes attributes of the customized feature faces and edges in various types, wherein attributes of a face mainly include a type of the face, a normal vector, and inner and outer loop information of the face; and attributes of an edge include a type of the edge, a normal vector, and concavity and convexity of the edge;

a feature recognition and information extraction module 4 for, according to a STEP-format file of the part design model, acquiring an attribute adjacency graph (AAG) of a part, deleting all transitional features, blank faces and edges adjacent to the blank faces, and simplifying the attribute adjacency graph of the part to a manufacturing face adjacency graph (MFAG) of a feature; carrying out feature matching on the MFAG and the manufacturing feature information library, and if the matching is successful, recognizing corresponding features; if the matching is not successful, carrying out attribute decomposition on the MFAG, and integrating or dividing corresponding faces to obtain a plurality of feature sub-graphs, then carrying out feature matching on the feature sub-graphs and the manufacturing feature information library, and if the matching is successful, recognizing corresponding features; and for the recognized features, extracting product manufacturing information of each feature manufacturing face, including basic process design information and process auxiliary information, and outputting and storing the product manufacturing information in the XML file format to a background;

a manufacturing element creation module 5 for, according to content of a process decision rule, extracting feature information from the manufacturing feature information library, and carrying out information mapping on the feature information and a feature manufacturing rule library to complete the creation of a manufacturing element, wherein the manufacturing element comprises all manufacturing information of a feature or a feature face, including a manufacturing element name, a manufacturing feature type, a manufactured portion, a manufacturing method, a manufacturing precision, a manufacturing tool, a manufacturing machine tool, a manufacturing time, a work fixture, a cutting amount, a manufacturing allowance, a main shaft rotation speed and a cutting speed;

a manufacturing procedure generation module 6 for, for the created manufacturing element, by means of a manufacturing element clustering algorithm based on a weighted attribute fuzzy c-means, according to the influences of different manufacturing attributes on a clustering result, assigning different weights to attributes such as the manufacturing method, the manufacturing precision, the manufacturing tool, the manufacturing machine tool and the work fixture, determining a number of clusters c, an iteration ending threshold c and a number of iterations T, and clustering manufacturing elements with similar manufacturing attributes to generate manufacturing procedures by integration;

a part optimal procedure sequence obtaining module 7 for, by means of a genetic algorithm, carrying out optimized sequencing on the procedures generated by clustering to obtain an optimal procedure sequencing list for the part; and a process model creation module 8 for, with regard to the feature to be manufactured by each procedure, according to a reverse generation thought, using a half-space intersection or parametric modeling method to create, from the MBD design model, a manufacturing feature body of an Nth procedure (assuming that there are N procedures in total), wherein a procedure MBD model of the Nth procedure is a collection of the MBD design model and process information of the procedure; generating a procedure model of an (N−1)th procedure by means of carrying out a Boolean addition calculation on the manufacturing feature body and the design model; and creating manufacturing feature bodies and procedure models of the remaining procedures, until a final blank model is created, and then completing the creation of the procedure model.

The invention is further described below with reference to the specific embodiments.

Taking a differential case on a rear axle of an automobile as an example, the process of three-dimensional process design of the differential case is described in an integrated three-dimensional CAPP system based on Visual Studio 2012 and NX 10.0 platforms and developed in C++ and NXopen development languages.

According to a set of MBD standards established in the step S101, all process design information of part process design, including sizes and dimensional tolerances, geometric tolerances and references, surface roughness degrees, technical requirements, process information and attribute annotations, are determined. Then, a part design model is imported into NX software, and in a three-dimensional labeling module (e.g. Product Manufacturing Information, PMI module) of the NX software, all the information of the process design is defined and labelled to complete the creation of the MBD design model.

Then, a three-dimensional process design system is started, and feature recognition is carried out to recognize manufacturing features of a part. Features, such as holes, individually manufactured faces, grooves, steps, etc., and related parameters (such as quantity, manufacturing precision, and feature size) are recognized, and feature information is stored in an XML format for later use, thereby forming a manufacturing feature information library.

Then, according to a process decision rule, the feature information is extracted from the manufacturing feature information library, and information mapping is carried out on the feature information and a feature manufacturing rule library to complete the creation of a manufacturing element, wherein the manufacturing element includes all manufacturing information of a feature or a feature face, mainly including a manufacturing element name, a manufacturing feature type, a manufactured portion, a manufacturing method, a manufacturing precision, a manufacturing tool, a manufacturing machine tool, a manufacturing time, a work fixture, a cutting amount, a manufacturing allowance, a main shaft rotation speed, a cutting speed, etc.

Then, by means of a manufacturing element clustering algorithm based on a weighted attribute fuzzy c-means (WAFCM), according to the influences of different manufacturing attributes on a clustering result, the attributes are weighted to obtain a modified WAFCM algorithm, and procedures, which are generated by clustering, are finally determined. During solving of the WAFCM algorithm, input variables of the algorithm are determined, mainly including a manufacturing element data set X (all manufacturing elements), a manufacturing attribute vector P (a vector matrix composed of manufacturing method, precision, tool, machine tool, tooling, feature, cutting amount, main shaft rotation speed, cutting speed and manufacturing allowance), a number of clusters c (taking a value of 15), a weighted index m (taking a value of 2), an iteration threshold ε (taking a value of e−4), and a maximum number of iterations T1 (takin a value of 800). According to an attribute calculation formula wj, the weights of the manufacturing attributes are determined by calculation as follows: manufacturing method (10.43%), precision (12.36%), tool (16.21%), machine tool (18.57%), tooling (11.84%), feature (11.01%), cutting amount (5.24%), main shaft rotation speed (5.573%), cutting speed (6.18%), and manufacturing allowance (2.59%). Finally, according to the iteration step of the WAFCM algorithm, the clustering result of the manufacturing elements is determined, and the manufacturing procedures are obtained.

By means of a genetic algorithm and based on the principle of "survival of the fittest", optimized sequencing is carried out on the manufacturing procedures. In the sequencing of the procedures, the genetic algorithm is configured as follows: initial population quantity M (taking a value of 50), crossover probability Pc (taking a value of 0.4), mutation probability Pm (taking a value of 0.05), and number of iterations T2 (taking a value of 500).

The process is generated as follows. The generated process information is displayed in the form of a process information tree, and includes a process MBD model, a procedure model, manufacturing features, manufacturing conditions and procedure information of each procedure.

Finally, a three-dimensional process flow of the differential case gradually evolving from a blank to a design model is formed, and a process information tree and a process MBD model are finally generated, in which a manufacturing feature body is labelled with manufacturing parameters of a corresponding procedure, and the process MBD model is labelled with the process design information. Finally, a three-dimensional process file with better readability, namely the process MBD model is established, the information content of the process information tree is stored in the XML file format for later use, and the process MBD model is stored in a JT file format as a three-dimensional process file. By now, the three-dimensional process design flow ends.

In the embodiments described above, it may be implemented in whole or in part by software, hardware, firmware, or any combination thereof. When implemented in whole or in part as a computer program product, the computer program product includes one or more computer instructions. When the computer program instructions are loaded or executed in a computer, the processes or functions described in accordance with embodiments of the present invention are generated, in whole or in part. The computer may be a general purpose computer, a special purpose computer, a computer network, or other programmable devices. The computer instructions may be stored in a computer-readable storage medium or transmitted from one computer-readable storage medium to another computer-readable storage medium, e.g., from one web site, computer, server, or data center to another web site, computer, server or data center in a wired (e.g., coaxial cable, fiber optic, digital subscriber line (DSL)) manner, or in a wireless (e.g., infrared, wireless, microwave, etc.) manner. The computer-readable storage medium may be any available medium that can be accessed by a computer or a data storage device, such as a server, data center, or the like, that includes one or more integrated available media. The available media may be magnetic media (e.g., floppy disk, hard disk, magnetic tape), optical media (e.g., DVD), or semiconductor media (e.g., Solid State Disk (SSD)), etc.

What described above are merely preferred embodiments of the present invention and are not intended to be limiting thereof, and all modifications, equivalents, and improvements made within the spirit and principles of the present invention are intended to be included within the scope of the present invention.

What is claimed is:

1. An MBD-based three-dimensional process designing method for a typical automobile machined part, characterized in that, the MBD-based three-dimensional process designing method for the typical automobile machined part comprises the following steps of:

by taking three-dimensional CAD software as a carrier, an MBD design model as an unique data input, and a three-dimensional process MBD model as a data output, sequentially carrying out establishment of MBD-related standards, creation of an MBD design model, feature classification and creation of a feature information library, feature recognition and information extraction, generation of manufacturing elements, clustering of the manufacturing elements and generation of procedures, sequencing of the procedures, and creation of manufacturing feature bodies and procedure models; and generating a process MBD model integrating the procedure models and the manufacturing feature bodies to realize visualization of a process design flow;

comprising the following steps of:

Step 1, establishing MBD-related standards according to requirements for the creation of an MBD design model;

Step 2, according to a set of the established MBD standards, determining all process information of part process design, including sizes and dimensional tolerances, geometric tolerances and references, face roughness degrees, technical requirements, process information and attribute annotations, and defining and labelling, in a three-dimensional labeling module of the CAD software, all the information of the process design to complete the creation of the MBD design model;

Step 3: according to a design model of a typical part, carrying out attribute customization and feature classification on features of the model, wherein the customized features are classified according to a manufacturing face adjacency graph (MFAG) of the feature, and the classified features include individually manufactured faces, steps, holes, grooves and bosses; and then completing creation of a manufacturing feature information library in an XML file format, wherein the feature information library includes attributes of the customized feature faces and edges in various types, wherein attributes of a face mainly include a type of the face, a normal vector, and inner and outer loop information of the face; and attributes of an edge include a type of the edge, a normal vector, and concavity and convexity of the edge;

Step 4: according to a STEP-format file of the part design model, acquiring an attribute adjacency graph (AAG) of a part, deleting all transitional features, blank faces and edges adjacent to the blank faces, and simplifying the attribute adjacency graph of the part to a manufacturing face adjacency graph (MFAG) of a feature; carrying out feature matching on the MFAG and the manufacturing feature information library, and if the matching is successful, recognizing corresponding features; if the matching is not successful, carrying out attribute decomposition on the MFAG, and integrating or dividing corresponding faces to obtain a plurality of feature sub-graphs, then carrying out feature matching on the feature sub-graphs and the manufacturing feature information library, and if the matching is successful, recognizing corresponding features; and for the recognized features, extracting product manufacturing information of each feature manufacturing face, including basic process design information and process auxiliary information, and outputting and storing the product manufacturing information in the XML file format to a background;

Step 5: according to content of a process decision rule, extracting feature information from the manufacturing feature information library, and carrying out information mapping on the feature information and a feature manufacturing rule library to complete the creation of a manufacturing element, wherein the manufacturing element comprises all manufacturing information of a feature or a feature face, including a manufacturing element name, a manufacturing feature type, a manufactured portion, a manufacturing method, a manufacturing precision, a manufacturing tool, a manufacturing machine tool, a manufacturing time, a work fixture, a cutting amount, a manufacturing allowance, a main shaft rotation speed and a cutting speed;

Step 6, for the manufacturing element created in Step 5, by means of a manufacturing element clustering algorithm based on a weighted attribute fuzzy c-means (WAFCM), according to the influences of different manufacturing attributes on a clustering result, assigning different weights to attributes such as the manufacturing method, the manufacturing precision, the manufacturing tool, the manufacturing machine tool and the work fixture, determining a number of clusters c, an iteration ending threshold s and a number of iterations T, and clustering manufacturing elements with similar manufacturing attributes to generate manufacturing procedures by integration;

Step 7, by means of a genetic algorithm, carrying out optimized sequencing on the procedures generated in Step 6 to obtain an optimal procedure sequencing list for the part; and Step 8: with regard to the feature to be manufactured by each procedure, according to a reverse generation thought, using a half-space intersection or parametric modeling method to create, from the MBD design model, a manufacturing feature body of an Nth procedure, wherein a procedure MBD model of the Nth procedure is a collection of the MBD design model and process information of the procedure, and therefore, a procedure model of an (N−1)th procedure is generated by means of carrying out a Boolean addition calculation on the manufacturing feature body and the design model, and on this basis, creating manufacturing feature bodies and procedure models of the remaining procedures, until a final blank model is created, and then completing the creation of the procedure model.

2. The MBD-based three-dimensional process designing method for the typical automobile machined part of claim 1, characterized in that, in Step 1, the MBD standards include:

(1) MBD three-dimensional model definition and creation standards, including basic definition and data set completeness requirements for a part MBD model, three-dimensional modeling and assembly requirement for an MBD model, and technical requirements for generating a three-dimensional engineering drawing;

(2) MBD three-dimensional labeling standards, including expression of an MBD model data set in a three-dimensional environment, specifically including selection of views of an MBD model, indication of sizes, dimensional tolerances and fits, indication of geometric tolerances and references and face roughness degrees, specifications for drawing a sectional view, part references and arrangement in an MBD assembly model, and specifications for drawing a part list; and (3) MBD process and tooling expression standards, including expression specifications for a metal cutting process and symbols and parameters thereof for a machined part, and expression specifications for positioning and fixing methods and symbols thereof.

3. The MBD-based three-dimensional process designing method for the typical automobile machined part of claim 1, characterized in that, Step 6 specifically comprises the following steps of:

firstly, creating a manufacturing element clustering mathematical model based on a weighted attribute fuzzy c-means (WAFCM); defining n manufacturing elements generated based the feature information rule library and the feature manufacturing rule library as n samples in a data set to be clustered $x=\{x_1, x_2, \ldots x_n\} \subset R^s$, by means of typical fuzzy c-mean clustering analysis, dividing $x_1, x_2, \ldots, x_n$ into c fuzzy subsets according to the similarity of manufacturing attributes corresponding to the n manufacturing elements in X, and defining the fuzzy subsets as a procedure set corresponding to the features $V=\{v_1, v_2, \ldots, v_c\}$, i.e. clustering centers of fuzzy clustering;

then, according to the classification of the manufacturing attributes of the manufacturing elements in Step 5, defining p manufacturing attributes contained in each sample in the data set X, which are denoted by $P=\{p_1, p_2, \ldots, p_n\} \subset R^p$, as an attribute vector of the n manufacturing elements such that in the WAFCM manufacturing element clustering algorithm, the kth sample point is denoted as $x_k=(x_{1k}, x_{2k}, \ldots, x_{pk})$, $k \in \{1, 2, \ldots, n\}$, and the clustering centers of the manufacturing elements are denoted as $v_i=(v_{i1}, v_{i2}, \ldots, v_{tp})$, $i \in \{1, 2, \ldots, c\}$; calculating the influences of information defined by different manufacturing attributes of each clustering sample on the overall clustering, and assigning a weight W to each manufacturing attribute, wherein if a manufacturing attribute provides a positive effect on the clustering of the samples, a relatively large weight is assigned, otherwise a relatively small weight is assigned;

then, defining a fuzzy membership matrix $U=[\mu_{ijk}] \in R$, $i=1, 2, \ldots, c$; $j=1, 2, \ldots, p$; $k=1, 2, \ldots n$, and building an objective function representing weighted similarity between the manufacturing element sample data points and the procedure clustering centers such that on the basis of typical fuzzy c-means clustering, the manufacturing attributes are weighted to obtain an objective function $J_m$ of the modified WAFCM algorithm:

$$\min J_m(U, V, W) = \sum_{i=1}^{c} \sum_{k=1}^{n} \sum_{j=1}^{p} (u_{ijk})^m \| w_j x_{jk} - v_{ij} \|^2;$$

in the formula, $u_{ijk}$ represents a membership degree of a clustered manufacturing element sample point $x_k$ belonging to a $v_i$th procedure on a manufacturing attribute j and reflects the similarity degree between the sample point and the clustering center, if $u_{ijk}$ is close to 1, it indicates that the degree of belonging to the clustering center is high, and if close to 0, the degree of belonging to the clustering center is low; and m represents a weighted index, $m \in (1, +\infty)$, and takes a value of m=2;

then, according to a clustering criterion, with constraint conditions of the objective function, finding an optimal (U, V, V) to minimize $J_m(U, V, W)$, including calculating a partial derivative of $J_m(U, V, W)$ with respect to each of U, V, W, and by means of the Lagrange multiplier method, calculating the values of $u_{ijk}$, $v_{ij}$, $w_j$ which minimize $J_m(U, V, W)$ according to the constraint conditions, as shown in the following formulas:

$$u_{ijk} = \left[ \sum_{h=1}^{c} \sum_{l=1}^{p} \left( \frac{\|w_j \cdot x_{jk} - v_{ij}\|}{\|w_j \cdot x_{lk} - v_{hl}\|} \right)^{\frac{2}{m-1}} \right]^{-1}, i \neq h, j \neq l,$$

$$v_{ij} = \frac{\sum_{k=1}^{n} (u_{ijk})^m x_{jk} \cdot w_j}{\sum_{k=1}^{n} (u_{ijk})^m},$$

$$w_j = \frac{\sum_{k=1}^{n}\sum_{i=1}^{c} u_{ijk}}{n};$$

and finally, solving the WAFCM clustering algorithm:
1) determining input variables of the algorithm, including the manufacturing element data set X, the attribute vector P, the number of clusters c, the weighted index m, the iteration threshold ε, and the maximum number of iterations T, and setting an iteration counter t=0;
2) normalizing the data set X, initializing a membership degree matrix $U^{(0)}$ to satisfy a constraint condition $$\sum_{i=1}^{c}\sum_{j=1}^{p} u_{ijk} = 1, u_{ijk} \in [0, 1],$$

and setting an initial attribute weight matrix $W^{(0)}$ with each item having an initial value of $w_j=1/p$, wherein p is the number of manufacturing element attributes;
3) continuously updating the membership matrix $U^{(t)}=[u_{ijk}]_t$, the prototype matrix $V^{(t)}=[v_{ij}]_t$ and the attribute weight matrix $W^{(t)}=[w_j]_t$ according to the formulas $u_{ijk}$, $v_{ij}$, $w_j$; and if t=T or $|J_t-J_{t-1}|\le\varepsilon$, accumulating the membership degrees of the manufacturing element samples based on each weighted attribute to obtain the membership degrees of the manufacturing element samples for procedure clustering according to a calculation formula as shown in $$u_{ik} = \sum_{j=1}^{p} u_{ijk};$$

and determining the procedure to which each manufacturing element belongs according to the membership degrees; otherwise, repeating the step 3).

4. The MBD-based three-dimensional process designing method for the typical automobile machined part of claim 1, characterized in that, in Step 7, the manufacturing attributes, such as the manufacturing method, the manufacturing precision, the manufacturing tool, the manufacturing machine tool and the work fixture, of the procedures generated by clustering in the Step 6 are defined as the phenotype of a gene, and the gene is encoded to obtain an initial population with a potential solution; then, based on the principle of "survival of the fittest", evolution is carried out from generation to generation to generate an optimal individual of the population, wherein in each generation, firstly, the individuals of the population are recombined, then each individual of the population is evaluated according to a fitness function which takes minimizing the manufacturing time as an optimization target, individuals with high fitness are selected and subjected to crossover and mutation operations according to a certain probability to generate a next generation of population, and an optimal individual of the last generation of population is decoded to obtain an approximate optimal solution, i.e. a sequence of procedures;
specifically including the following steps of:
encoding: defining the manufacturing attributes, such as the manufacturing method, the manufacturing precision, the manufacturing tool, the manufacturing machine tool and the work fixture, of the procedures generated by clustering in Step 6 as the phenotype of a gene and encoding the gene by means of a binary encoding method;
initial population obtaining: generating a series of initial code chains by means of a random method to obtain an initial population with a potential solution;
chromosome recombination: according to manufacturing rules and manufacturing attribute constraints, recombining chromosomes of the population before an iteration of initial chromosomes and after each crossover and mutation:
carrying out calculation according to a fitness function which takes minimizing the manufacturing time as an optimization target to evaluate individuals of the population;
crossover: carrying out single-point crossover by selecting individuals with high fitness in the population, selecting breakpoints according to a crossover probability, and carrying out single-point crossover on chromosomes behind the breakpoints to form new chromosomes;
mutation: selecting individuals with high fitness in the population, selecting a plurality of individuals according to a mutation probability, and randomly selecting a gene locus from the selected plurality of individuals to be changed into an allele; and
iteration: generating a new generation of population by each iteration, and when a preset number of iterations is reached or it converges to an optimal solution, ending the calculation; and decoding the optimal individual of the last generation of population to obtain an approximate optimal solution, i.e. the optimal sequence of procedures.

5. The MBD-based three-dimensional process designing method for the typical automobile machined part of claim 1, characterized in that, in Step 8, the manufacturing feature body is a collection of volumes to be cut off by each procedure, and for the creation of the manufacturing feature body, a half-space intersection or parametric modeling method is used to obtain the manufacturing feature body according to attribute characteristics and generation modes of the interactive and non-interactive features obtained by classification of the manufacturing features;
wherein features that are recognized by directly carrying out matching on the manufacturing face adjacency graph MFAG of the manufacturing feature and the manufacturing feature information library, are non-interactive features, and the parametric modeling method is directly used to generate the manufacturing feature body;
features that are recognized by carrying out attribute decomposition on the manufacturing face adjacency graph NMFAG, integrating or dividing corresponding faces to generate feature sub-graphs, and carrying out matching on the feature sub-graphs and the manufacturing feature information library, are interactive features which do not directly match with any feature pattern, and the half-space intersection method is used to generate the manufacturing feature body;
a geometric relationship between the manufacturing feature bodies and the procedure models includes: for a machined part with n procedures, in reverse generation of the procedure models, in the sense of geometric modeling, the procedure model $WPM_j$ of a jth procedure is generated by carrying out a Boolean addition calculation on a procedure model WPM$_{j+1}$ and the manufacturing feature bodies of a (j+1)th procedure, i.e., $$WPM_j = WPM_{j+1} \oplus \sum_{k=1}^{m} MFV_k^{j+1},$$

in the formula, E represents a set of types and does not represent a summation operator; 1≤j≤n, 1≤k≤m; MFV$_k^{j+1}$ represents a kth manufacturing feature body of the (j+1)th procedure, and in is the number of manufacturing feature bodies; and ⊕ represents a Boolean addition operator;

the half-space intersection method: a half-enclosed space is formed by extending and intersection of faces, and for a certain manufacturing feature, a manufacturing face set MF$_i$ and an adjacent face set AF$_j$ of the manufacturing feature are obtained, and the face sets are extended and intersected to obtain half-space bodies H{MF$_i$} and H{AF$_j$}; the manufacturing feature body is obtained by carrying out a Boolean intersection calculation on the two half-spaces, i.e. MFV$_{ij}$=H{MF$_i$}⊕H{AF$_j$};

the process model is an expression of a collection of the manufacturing feature bodies and the procedure models, and the process MBD model is expressed as follows:

$$PIM = \sum_{j=1}^{n} \left\{ WPM_i \cup \sum_{k=1}^{m} MFV_k^i \cup PI_i \right\}$$

in the formula, PIM represents the process MBD model of the machined part; WPM$_i$ represents a procedure model of an ith procedure; MFV$_k^i$ represents a kth manufacturing feature body of the ith procedure, and in is the number of manufacturing feature bodies; PI$_i$ represents process information belonging to the procedure MBD model corresponding to the ith procedure.

6. An MBD-based three-dimensional process designing platform for a typical automobile machined part for implementing the method of claim 1, characterized in that, the MBD-based three-dimensional process designing platform for the typical automobile machined part includes:

an MBD related standard establishing module for establishing MBD-related standards according to requirements for the creation of an MBD design model;

an MBD design model creation module for, according to a set of the established MBD standards, determining all process information of part process design, including sizes and dimensional tolerances, geometric tolerances and references, face roughness degrees, technical requirements, process information and attribute annotations, and defining and labelling, in a three-dimensional labeling module of CAD software, all the information of the process design to complete the creation of the MBD design model;

an attribute customization and feature classification module for, according to a design model of a typical part, carrying out attribute customization and feature classification on features of the model, wherein the customized features are classified according to a manufacturing face adjacency graph (MFAG) of the feature, and the classified features include individually manufactured faces, steps, holes, grooves and bosses; and then completing creation of a manufacturing feature information library in an XML file format, wherein the feature information library includes attributes of the customized feature faces and edges in various types, wherein attributes of a face mainly include a type of the face, a normal vector, and inner and outer loop information of the face; and attributes of an edge include a type of the edge, a normal vector, and concavity and convexity of the edge;

a feature recognition and information extraction module for, according to a STEP-format file of the part design model, acquiring an attribute adjacency graph (AAG) of a part, deleting all transitional features, blank faces and edges adjacent to the blank faces, and simplifying the attribute adjacency graph of the part to a manufacturing face adjacency graph (MFAG) of the feature; carrying out feature matching on the MFAG and the manufacturing feature information library, and if the matching is successful, recognizing corresponding features; if the matching is not successful, carrying out attribute decomposition on the MFAG, and integrating or dividing corresponding faces to obtain a plurality of feature sub-graphs, then carrying out feature matching on the feature sub-graphs and the manufacturing feature information library, and if the matching is successful, recognizing corresponding features; and for the recognized features, extracting product manufacturing information of each feature manufacturing face, including basic process design information and process auxiliary information, and outputting and storing the product manufacturing information in the XML file format to a background;

a manufacturing element creation module for, according to content of a process decision rule, extracting feature information from the manufacturing feature information library, and carrying out information mapping on the feature information and a feature manufacturing rule library to complete the creation of a manufacturing element, wherein the manufacturing element comprises all manufacturing information of a feature or a feature face, including a manufacturing element name, a manufacturing feature type, a manufactured portion, a manufacturing method, a manufacturing precision, a manufacturing tool, a manufacturing machine tool, a manufacturing time, a work fixture, a cutting amount, a manufacturing allowance, a main shaft rotation speed and a cutting speed;

a manufacturing procedure generation module for, for the created manufacturing element, by means of a manufacturing element clustering algorithm based on a weighted attribute fuzzy c-means (WAFCM), according to the influences of different manufacturing attributes on a clustering result, assigning different weights to attributes such as the manufacturing method, the manufacturing precision, the manufacturing tool, the manufacturing machine tool and the work fixture, determining a number of clusters c, an iteration ending threshold ε and a number of iterations T, and clustering manufacturing elements with similar manufacturing attributes to generate manufacturing procedures by integration;

a part optimal procedure sequence obtaining module for, by means of a genetic algorithm, carrying out optimized sequencing on the procedures generated by clustering to obtain an optimal procedure sequencing list for the part; and a process model creation module for, with regard to the feature to be manufactured by each procedure, according to a reverse generation thought, using a half-space intersection or parametric modeling method to create, from the MBD design model, a manufacturing feature body of an Nth procedure, wherein a procedure MBD model of the Nth procedure is a collection of the MBD design model and process information of the procedure, generating a procedure model of an (N−1)th procedure by means of carrying out a Boolean addition calculation on the manufacturing feature body and the design model; and creating manufacturing feature bodies and procedure models of the remaining procedures, until a final blank model is created, and then completing the creation of the procedure model.

7. A terminal, characterized in that, the terminal is equipped with a controller implementing an MBD-based three-dimensional process designing method for a typical automobile machined part according to claim 1.

8. A non-transitory computer-readable storage medium, comprising instructions, when the instructions executed on a computer, the computer will perform an MBD-based three-dimensional process designing method for a typical automobile machined part according to claim 1.

* * * * *